United States Patent [19]

Ho

[11] Patent Number: 6,009,115
[45] Date of Patent: Dec. 28, 1999

[54] SEMICONDUCTOR MICRO-RESONATOR DEVICE

[75] Inventor: Seng-Tiong Ho, Wheeling, Ill.

[73] Assignee: Northwestern University, Evanston, Ill.

[21] Appl. No.: 09/304,874

[22] Filed: May 4, 1999

Related U.S. Application Data

[63] Continuation of application No. 08/859,559, May 20, 1997, Pat. No. 5,926,496, which is a continuation-in-part of application No. 08/653,585, May 24, 1996, Pat. No. 5,790,583, which is a continuation-in-part of application No. 08/450,284, May 25, 1995, Pat. No. 5,825,799.

[51] Int. Cl.$^6$ ........................................................ H01S 3/08
[52] U.S. Cl. ............................. 372/92; 372/94; 372/97; 372/20; 372/46; 385/24; 385/50; 359/127
[58] Field of Search ................................. 372/6, 20, 23, 372/26, 28, 45, 46, 50, 75, 92, 94, 67, 97, 98, 108; 385/24, 49, 50; 359/124, 126, 127, 132, 173, 107, 333

[56] References Cited

U.S. PATENT DOCUMENTS

| | | | |
|---|---|---|---|
| 4,720,160 | 1/1988 | Hicks, Jr. ................................... | 385/31 |
| 4,775,214 | 10/1988 | Johnson ................................... | 385/12 |
| 5,123,027 | 6/1992 | Lawrence ................................. | 372/92 |
| 5,446,579 | 8/1995 | Lomashevitch ......................... | 359/333 |
| 5,475,519 | 12/1995 | Kargl et al. ............................... | 359/168 |
| 5,475,704 | 12/1995 | Lomashevich ............................. | 372/92 |
| 5,742,633 | 4/1998 | Stone et al. ................................ | 372/92 |

Primary Examiner—Hemang Sanghavi
Attorney, Agent, or Firm—McAndrews, Held & Malloy, Ltd.

[57] ABSTRACT

An optical, semiconductor micro-resonator device includes a microcavity resonator and a pair of adjacent waveguides. The microcavity resonator may be formed as a disk, a ring or closed loop with arbitrarily curved circumference with a diameter of approximately $56000\lambda_{lg}/n_{res}$ or less where $\lambda_{lg}$ is the longest operating wavelength of light and $n_{res}$ is the propagating refractive index. A portion of each of the waveguides is disposed adjacent to the microcavity resonator wherein the adjacent portion may be either tangential to the microcavity resonator or curve about a respective portion of the microcavity resonator. Light propagating in the first waveguide with a wavelength on resonance with the microcavity resonator is coupled thereto via resonant waveguide coupling and from the microcavity resonator the light is coupled to the second waveguide for output therefrom. Light propagating in the first waveguide with a wavelength that is off resonance with the microcavity resonator is not coupled to the microcavity resonator but continues to propagate in the first waveguide for output therefrom. The microcavity resonator and waveguides are formed of semiconductor materials for on-chip integration with other semiconductor devices.

23 Claims, 6 Drawing Sheets

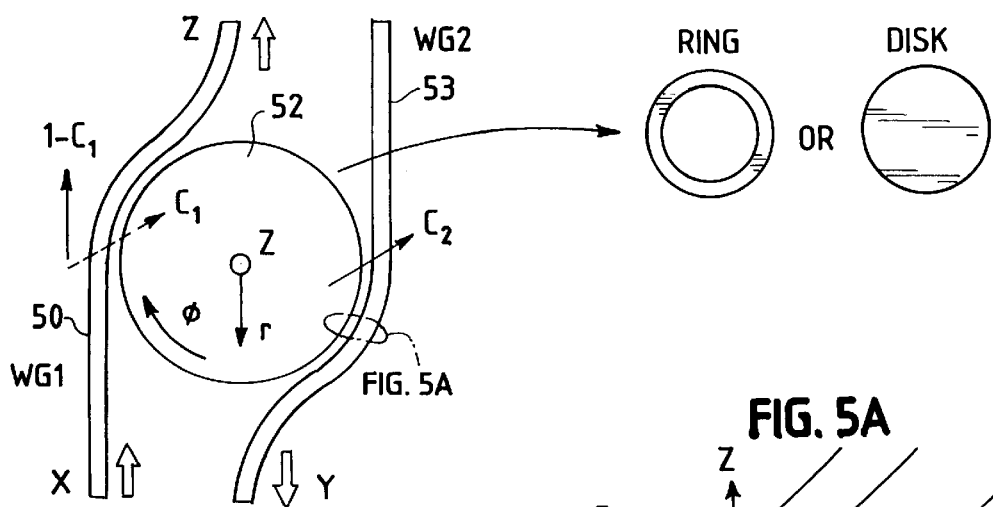
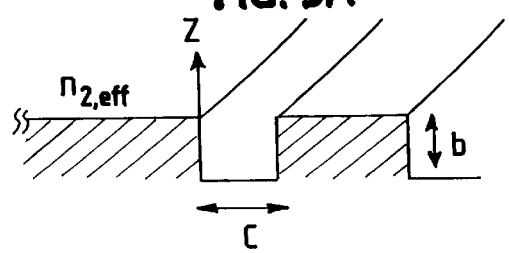
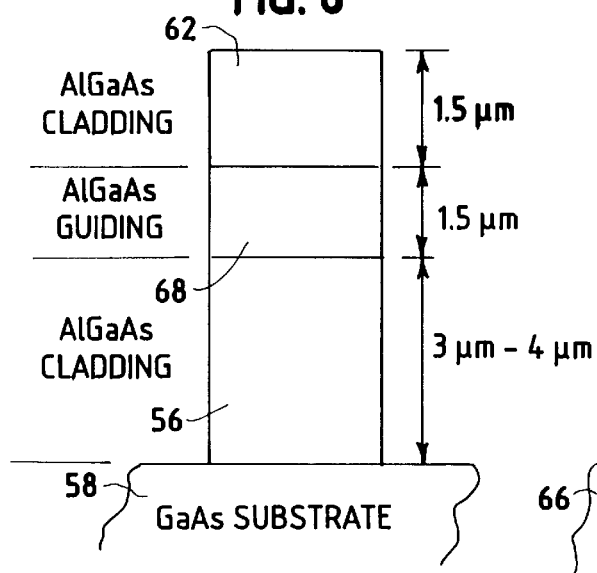
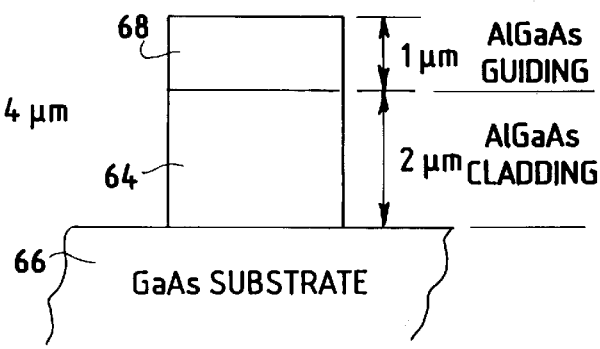
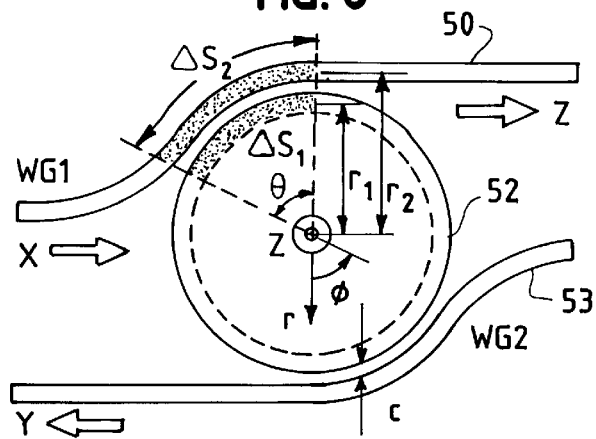

SEMICONDUCTOR MICRO-RESONATOR DEVICE

CROSS-REFERENCE TO RELATED APPLICATIONS

This is a continuation of U.S. patent application 08/859,559, filed May 20, 1997, now U.S. Pat. No. 5,926,496 which is a continuation-in-part of U.S. patent application 08/653,585 filed May 24, 1996, now U.S. Pat. No. 5,790,583 which is a continuation-in-part of U.S. patent application 08/450,284 filed May 25, 1995, now U.S. Pat. No. 5,825,799.

STATEMENT REGARDING FEDERALLY SPONSORED RESEARCH OR DEVELOPMENT

This work was supported by ARPA under contract F49620-96-1-0262 and NSF Faculty Early Career Development Award ECS-9502475.

TECHNICAL FIELD

The present invention relates to an optical, semiconductor micro-resonator device and more particularly to such a device including a semiconductor microcavity resonator, a first waveguide and a second waveguide. Light propagating in the first waveguide with a wavelength off resonance with the microcavity resonator is output from the first waveguide; whereas light propagating in the first waveguide with a wavelength on resonance with the microcavity resonator is coupled thereto and from the microcavity resonator the light is coupled to the second waveguide for output therefrom.

BACKGROUND OF THE INVENTION

One known optical resonator as described in the article "New Integrated Ring Resonator In Glass," W. J. Wang et al., Elec. Lett., Vol. 28, no. 21, page 1967–1968, Oct. 8, 1992, is a large ring resonator formed of glass that is used as a tunable wavelength selective filter for various optical frequencies. The path length of the glass resonator is on the order of 12 cm and it has a low finesse of 5. This glass ring resonator is not suitable for on-chip integration with semiconductor devices.

Another known resonator of smaller size and larger finesse is described in the article "An Optical FDM Distribution Experiment Using A High Finesse Waveguide-Type Double Ring Resonator," K. Oda et al. IEEE Photonics Tech. Lett., Vol. 6, no. 8, page 1031–1034, August 1994. The frequency division multiplexing distribution scheme of this article uses a $GeO_2$-doped silica double ring resonator having a diameter of 3500 $\mu$m and a finesse of 200. Although the diameter of the double ring resonator is small compared to that of the glass resonator, the high bending loss in the second ring of this resonator prevents reduction in its size. Also, the second ring required to attain the relatively high free spectral range (FSR) of the device complicates the manufacturing process.

BRIEF SUMMARY OF THE INVENTION

In accordance with the present invention, the disadvantages of prior optical resonator devices have been overcome. The optical resonator of the present invention is a semiconductor micro-resonator device that is much smaller in size than prior optical resonators. Because of the small size, the quality factor Q of the cavity and the finesse F of the device are potentially much higher than prior resonators. In addition, the frequency spacing between adjacent resonances of the cavity, referred to as the free spectral range, is also larger. Further because the resonator device of the present invention is fabricated from semiconductor materials it is suitable for on-chip integration with other semiconductor devices such as a semiconductor laser. In particular, the possibility of having resonator sizes of a few micrometers to tens of micrometers in accordance with the present invention, instead of resonator sizes on the order of hundreds or thousands of micrometers as of prior devices, enables the realization of ultra-high density photonic integrated circuits with component densities ten to ten thousand times higher than is currently possible with known devices.

More particularly, the micro-resonator device of the present invention includes a microcavity resonator formed of semiconductor materials and having a diameter of approximately $56000\lambda_{lg}/n_{res}$ or less where the device is designed for and has an associated operating range of wavelengths of light; $\lambda_{lg}$ is the longest operating wavelength of light in units of $\mu$m; and $n_{res}$ is the effective propagating refractive index of light in the microcavity resonator. The device also includes a first waveguide formed of semiconductor materials with a portion of the first waveguide disposed adjacent to the microcavity resonator. A portion of a second waveguide formed of semiconductor materials is also disposed adjacent to the microcavity resonator. Light propagating in the first waveguide with a wavelength on resonance with the microcavity resonator is coupled to the microcavity resonator and from the microcavity resonator the light is coupled to the second waveguide for output therefrom. Light propagating in the first waveguide with a wavelength that is off resonance with the microcavity resonator is not coupled to the microcavity resonator but continues to propagate in the first waveguide for output therefrom. Unlike a Fabry-Perot type resonator, such as those formed by two parallel mirrors or two sets of reflective gratings, there is no feedback of the off resonance light in the micro-resonator of the present invention.

The semiconductor micro-resonator device of the present invention can either be a weakly-guiding device or a strongly-guiding device. When formed as a weakly-guiding device, the diameter of the microcavity resonator is in the range of $560\lambda_{lg}/n_{res}$ $\mu$m to $56000\lambda_{lg}/n_{res}$ $\mu$m. When formed as a strongly-guiding device, the microcavity resonator has a diameter as small as $\lambda_{lg}/n_{res}$ microns through $560\lambda_{lg}/n_{res}$ $\mu$m.

The semiconductor micro-resonator device may be employed as an electro-optical modulator, a switch, an intensity modulator, a tunable optical filter, a phase modulator, a wavelength-division multiplexor and demultiplexor, among other applications. The high F of the present invention is particularly advantageous for a number of these applications since the resonator potentially requires only a $\pi/F$ phase shift instead of a $\pi$ phase shift within the cavity length, thereby reducing the switching voltage by a factor of F. Further, the high finesse and high free spectral range of the micro-resonator device of the present invention allows high wavelength resolution for demultiplexing applications and also allows dense wavelength-division multiplexing schemes which is particularly important when the device is to be used in a communication network or the like.

These and other advantages and novel features of the present invention, as well as details of an illustrated embodiment thereof, will be more fully understood from the following description and drawings.

BRIEF DESCRIPTION OF THE SEVERAL VIEWS OF THE DRAWINGS

FIG. 5 illustrates a second embodiment of the semiconductor micro-resonator device of the present invention wherein the waveguides are partially curved about respective portions of the microcavity resonator formed of a ring or a disk;

FIG. 5A illustrates the portion designated in FIG. 5.

FIG. 6 is an illustration of an example of the semiconductor wafer layers forming the microcavity resonator and waveguides in a weakly guiding device in accordance with the present invention;

FIG. 7 is an illustration of another example of the semiconductor wafer layers forming the microcavity resonator and waveguides in a strongly guiding device in accordance with the present invention;

FIG. 8 is a diagram illustrating the phase mismatch between the first waveguide and the microcavity resonator for a particular arc angle;

DETAILED DESCRIPTION OF THE INVENTION

Figure 1A:
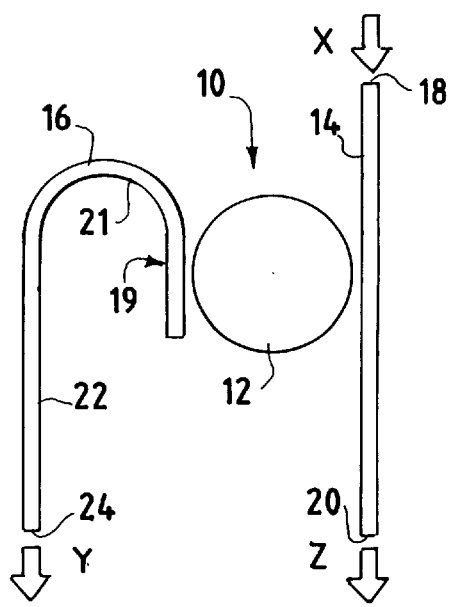
FIG. 1A is a diagram illustrating the geometry of the semiconductor micro-resonator device of the present invention having a microcavity resonator and adjacent waveguides.
Figure 11A:
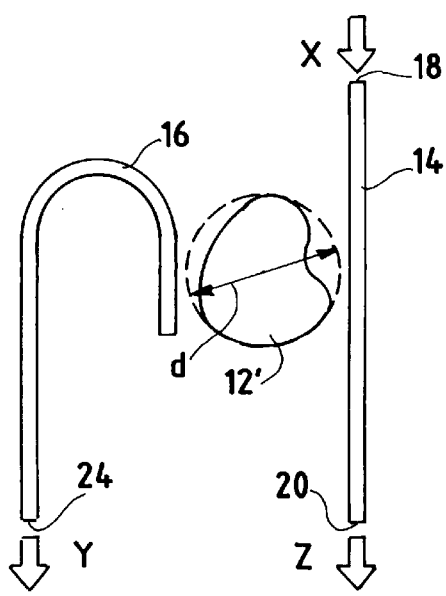
FIGS. 11A and B are diagrams illustrating the geometry of a respective disk and ring closed loop microcavity resonator having an arbitrarily curved circumference.
Figure 11B:
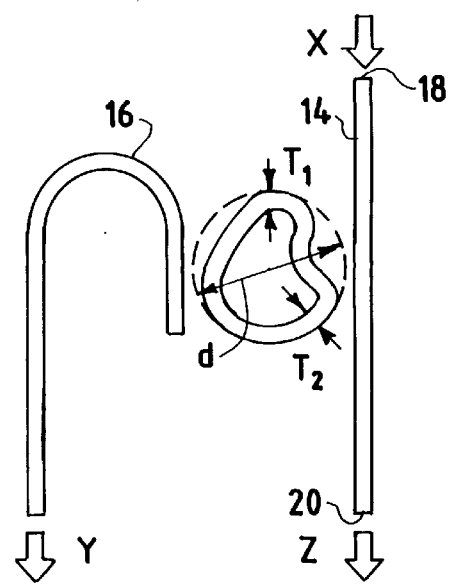

An optical, semiconductor micro-resonator device 10 as shown in FIG. 1A includes a microcavity resonator 12 and a pair of waveguides 14 and 16. The microcavity resonator has a range of operating wavelengths of light and has a diameter of approximately $56000\lambda_{lg}/n_{res}$ or less where $\lambda_{lg}$ is the longest operating wavelength of light in μm and $n_{res}$ is the effective propagating refractive index of light in the resonator. For example, for $\lambda_{lg}=1.5$ μm, the diameter of the microcavity resonator can be 28000 μm or less. The microcavity resonator is formed as a closed-loop resonator such as a disk or a ring. However, the closed loop resonator may also have an arbitrarily curved circumference in the form of a distorted disk or ring as shown respectively in FIGS. 11A and B. In the case of a distorted disk or ring, the effective diameter of the microcavity resonator is the diameter of the smallest circle within which the entire area of the resonator 12 can be contained. It is also noted that the width of the ring cavity need not be uniform but may vary throughout the ring.

The waveguide 14 has an input port 18 labeled X and an output port 20, labeled Z. The waveguide 16 has an output port 24 labeled Y. A portion of the waveguide 14 as shown in FIG. 1 is adjacent and tangential, i.e. in the direction of a tangent, to the microcavity resonator 12. Similarly, a portion of the waveguide 16 is adjacent and tangential to the micro-resonator 12. It is noted that the respective portions of each of the waveguides 14 and 16 adjacent to the microcavity resonator 12 need not be tangential but may curve around a portion of the microcavity resonator 12 as described below with reference to FIG. 8. Further, the microcavity resonator 12 may have portions of its sidewall in common with portions of the sidewall of the waveguides. Alternatively, the microcavity resonator 12 and waveguides may be separated by a gap. The gap between the microcavity resonator 12 and the waveguides 14 and 16 may be filled with air or one or more materials having a refractive index higher than air. In the embodiment where the materials filling the "gap" are the same as the materials forming the walls or a portion of the walls of the microcavity resonator 12 and waveguide 14 and 16, the resonator 12 and waveguide 14 and 16 are said to have a common sidewall portion and the thickness of the "gap" is equal to the thickness of the common sidewall portion.

Light propagating in the waveguide 14 having a wavelength that is off resonance with the microcavity resonator 12 is output from the output port 20 of the first waveguide 14. Light propagating in the waveguide 14 having a wavelength that is on resonance with the microcavity resonator 12 is coupled to the microcavity resonator via resonant waveguide coupling for propagation in the resonator 12. The light propagating in the microcavity resonator 12 is similarly coupled to the waveguide 16. The light coupled from the microcavity resonator 12 to the waveguide 16 propagates in the waveguide 16 in a direction opposite to the light traveling in the waveguide 14 due to the respective orientations of these components. So that the on resonant light coupled from the waveguide 14 via the microcavity resonator 12 will be output from the port 24 of the waveguide 16 in the same direction as off resonant light propagates from the output port 20 of the first waveguide 14, the waveguide 16 is formed with the portion 19 adjacent the resonator 12 extending into a curved portion 21 that in turn extends into a straight portion 22 having the output port 24.

Figure 1B:
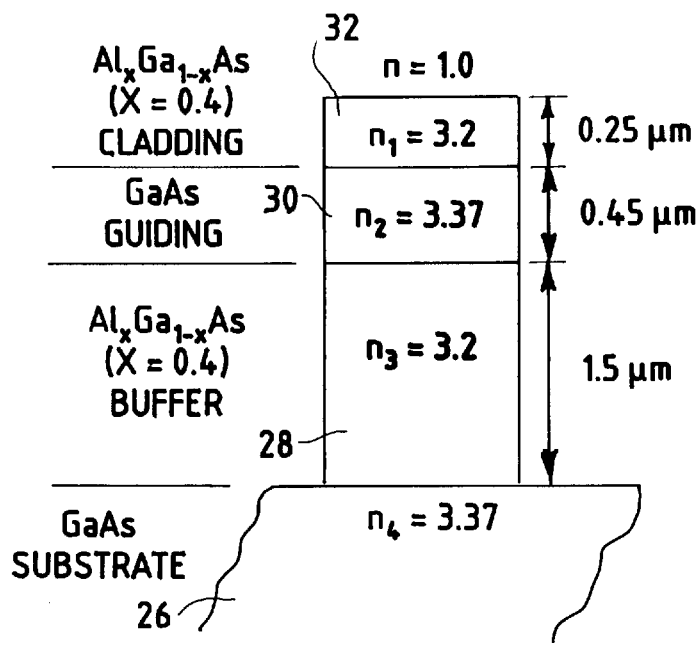
FIG. 1B is a cross sectional view of the semiconductor materials forming the microcavity resonator and the waveguides of FIG. 1A.

The micro-resonator device 10 is formed of semiconductor materials, as illustrated in FIG. 1B, for on-chip integration with other semiconductor devices such as a semiconductor laser. A wafer epitaxial growth process is used to form the various semiconductor layers of the device 10 on a substrate. As shown in the embodiment of FIG. 1B, a first cladding layer 28 of $Al_xGa_{1-x}As$ where X equals 0.4, is formed on a substrate 26 of GaAs. A guiding layer 30 of GaAs is formed on the first cladding layer 28 and a second cladding layer 32 of $Al_xGa_{1-x}As$, where X equals 0.4, is formed on the guiding layer 30. The substrate in this embodiment has a refractive index of $n_4$=3.37. The respective refractive indices $n_1$ and $n_3$ of the second cladding layer 32 and the first cladding layer 28 are equal to 3.2 and the refractive index $n_2$ of the guiding layer 30 is 3.37. The refractive index, n=1.0, illustrates the refractive index of air. In this example, the thickness of the layer is 2.0 μm, the thickness of the guiding layer 30 is 0.45 μm and the thickness of the top cladding layer is 0.25 μm.

It is noted that the wafer may be formed of materials different than as described above. For example, other suitable materials for the guiding layer 30 include $Al_xGa_{1-x}As$ where $0 \leq x \leq 1$ and $In_xGa_{1-x-y}As_yP$ where $0 \leq x \leq 1$ and $0 \leq y \leq 1$. Suitable materials for the first and second cladding layer include $Al_xGa_{1-x}As$ and $Al_xGa_{1-x}N$ where $0 \leq x \leq 1$ and $0 \leq y \leq 1$ and $In_xGa_{1-x-y}As_yP$ where $0 \leq x \leq 1$ and $0 \leq y \leq 1$. Further, the first and second cladding layers can be transparent conductors such as $InSnO_2$ or dielectric materials with refractive indices lower than the refractive index of the guiding layer. Similarly, various materials for the substrate may be used as well. For example, InP is another suitable substrate material.

After the semiconductor wafer is formed, a thin layer of $SiO_2$ is deposited on the wafer so as to provide a durable mask capable of withstanding chemically assisted ion beam etching (CAIBE) where the thickness of this layer is approximately 2000 angstroms. The $SiO_2$ layer is coated with a PMMA resist layer. Electron-beam lithography is used to create the patterns defining the outer walls of the microcavity resonator 12 and the waveguides 14 and 16 in the PMMA resist. It is noted that when the microcavity resonator is formed as a ring, this process is also used to define the inner wall of the microcavity ring. The electron-beam lithography exposure conditions may be set, for example, as follows: a 300-pA probe current, a 50 keV acceleration, a 80 μm×80 μm field, and a 11-mm working distance.

The PMMA mask thus formed is transferred to the underlying $SiO_2$ layer using reactive ion etching. The resulting $SiO_2$ layer provides a durable mask capable of withstanding the CAIBE process. In this example, the CAIBE parameters may be set as follows: a beam voltage of 500 V, a beam current density of 0.14 mA/cm², a chlorine flow rate of 15 sccm, an argon flow rate of 2 sccm and an elevated substrate temperature of 100° C. In the above example, the micro-resonator device 10 is etched to a depth of 2.2 μm at an etch rate of 0.1 μm/min. The CAIBE etch results in a trench that defines the outer walls of the microcavity resonator 12 and the waveguides 14 and 16 wherein, in one example for $\lambda_{lg}$=1.5 μm, the diameter of the resonator 12 is 10.5 μm and the waveguide width adjacent the resonator 12 is 0.5 μm. It is noted that the width of the waveguide need not be uniform but may be wider near one or both of the input and/or output ports to aid in coupling light to and from the device 10. For example, the waveguides 14 and 16 may be 2 μm wide at each port but gradually taper to 0.5 μm near the microcavity resonator 12.

The trench defining the outer walls of the microcavity resonator 12 and waveguides 14 and 16 may be on the order of 0.1 μm. However, the gap between the adjacent portions of the waveguide 14 and microcavity resonator 12 in this example is only on the order of 0.1 μm as is the gap between the microcavity resonator 12 and adjacent portion of the waveguide 16 for efficient resonant waveguide coupling as discussed in more detail below. The depth of the etching may extend into this buffer layer 28 since the etching depth can be difficult to precisely control. The first cladding layer 28 serves to isolate the guiding layer 30 from the substrate and minimize leakage loss.

Several of the key micro-resonator design parameters include the coupling efficiency, the waveguide scattering loss and the waveguide to substrate leakage loss. The coupling efficiency is a function of the coupling length, waveguide structure and gap size. For a waveguide structure having strong waveguide confinement and diameters less than or equal to $560\lambda_{lg}/n_{res}$ μm, small gaps between the waveguides and the microcavity resonator as described in the above example are required for adequate coupling efficiency. As noted above, the "gap" region can be filled with air or materials with a refractive index higher than air. The materials surrounding the microcavity resonator, the pair of waveguides and the gap region have refractive indices typically smaller than the refractive index of the guiding layer of the microcavity resonator to facilitate confinement of light in the waveguides and the resonator. For good transmission characteristics, the resonator coupling should be greater than the roundtrip cavity loss of the resonator. The desired range of coupling is typically 0.5% to 3% depending on the waveguide propagation or scattering loss which is primarily due to the roughness of the sidewalls of the micro-resonator 10. For a waveguide width of 0.5 μm, a waveguide thickness of 0.45 μm and a gap size of 0.1 μm, the calculated coupling efficiency is 2.5% at an operating wavelength of 1.5 μm for an effective coupling length of 1 μm. In general, it is desirable to have a gap size no larger than $$\frac{2\lambda_{lg}}{\sqrt{n_{res}^2 - n_{gap}^2}} 1$$

where $n_{gap}$ the popagating refractive index of the gap.

In the above example, from the transmission Fabry-Perot resonances measured from the end facets of the individual waveguides, the TM waveguide intensity propagation or scattering loss α is 3.2/cm for a 0.5 μm waveguide. From this value a 1.2% roundtrip cavity loss is estimated in a microcavity ring resonator 12 having a diameter of 10.5 μm. It is noted that a microcavity resonator 12 in the form of a disk has the advantage of lower waveguide scattering loss than a microcavity ring since only the outer sidewall of the disk is etched as opposed to both an outer sidewall and an inner sidewall in the case of the microcavity ring resonator. The scattering loss with a microcavity disk resonator is potentially on the order of one half of that of a microcavity ring resonator.

Light from a light source is coupled into cleaved end facets of the waveguide 14 via a lens that focuses the input light to the waveguide input port 18. A lens is also employed to recollimate the light output from the respective output ports 20 and 24 of the waveguides 14 and 16. The light source for the micro-resonator may be, for example, a tunable laser diode. The lenses, used at the input and output ports of the resonator may have, for example, a numerical aperture of 0.55 and a focal length of 4.5 mm. A wideband Gausian pulse modulating the carrier laser of a given frequency is used to excite light propagating in the waveguide 14 in its fundamental mode. For a microdisk resonator, the mode size supported by the adjacent waveguides must match the whispering gallery mode (WGM) width propagating in the microdisk resonator 12. Proper mode matching is employed to support single-mode behavior within the microcavity disk and to optimize the coupling between the waveguides and microcavity disks. Conformal transformations may be used to calculate the lowest order WGM width. For microcavity disks having diameters of 10.5 μm and 20.5 μm, the respective calculated WGM widths are 0.5 and 0.6 μm.

Figure 2A:
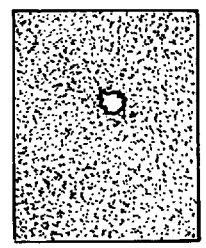
FIG. 2A is an illustration of an image taken with an infrared vidicon camera of the output from a port Z of a first waveguide of FIG. 1A.
Figure 2B:
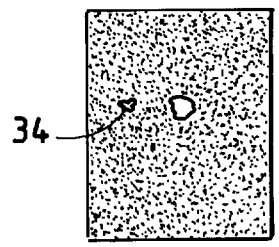
FIG. 2B is an illustration of an image taken with an infrared vidicon camera of the outputs from the respective ports Y and Z of the respective second waveguide and the first waveguide of FIG. 1A as the light input to the first waveguide is becoming on resonance with the micro resonator disk.
Figure 2C:
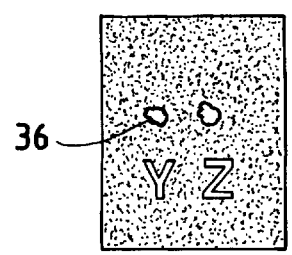
FIG. 2C is an image taken with an infrared vidicon camera of the outputs from the respective ports Y and Z of the second and first waveguides when the wavelength of light input to the first waveguide is tuned to on resonance with the microcavity resonator disk.

FIG. 2A shows an image taken with an infrared vidicon camera of the light from the output port 20 of the waveguide 14 wherein the light propagating in the waveguide 14 is off resonance with the microcavity resonator 12. As the laser diode is tuned towards on resonance, the light propagating in the waveguide 14 begins to be coupled to the microcavity resonator 12 and therefrom to the waveguide 16 so that resonant light begins to appear at the output port 24 of the waveguide 16 as illustrated by the light spot 34 of FIG. 2B. When the light propagating in the waveguide 14 is on resonance with the microcavity resonator 12, the on resonant light coupled from the input waveguide 14 to the waveguide 16 via the microcavity resonator 12 is as illustrated in FIG. 2C. In particular, the on resonant light at the output port 24 of the waveguide 16 is illustrated by the light spot 36 and is 40%–50% of the light input to the waveguide 14 at the port 18.

Figure 3A:
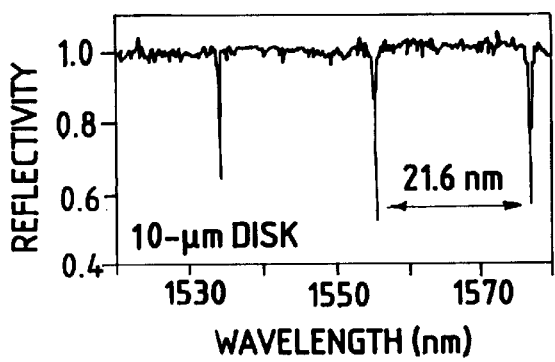
FIGS. 3A–D are graphs illustrating the reflectivity of a respective 10 μm microcavity disk, a 10 μm microcavity ring, a 20 μm microcavity disk and a 20 μm microcavity ring.
Figure 3B:
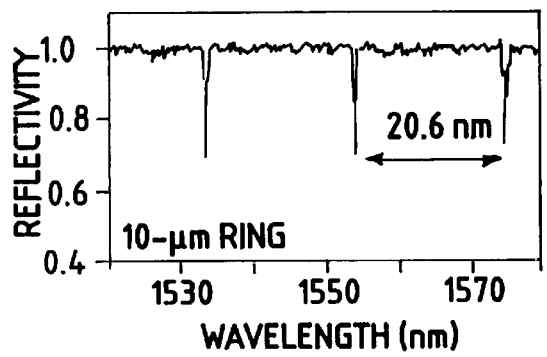
Figure 3C:
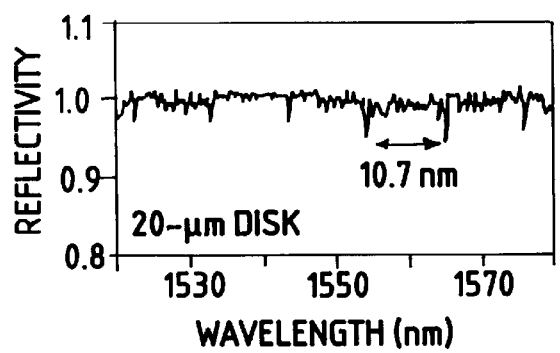
Figure 3D:
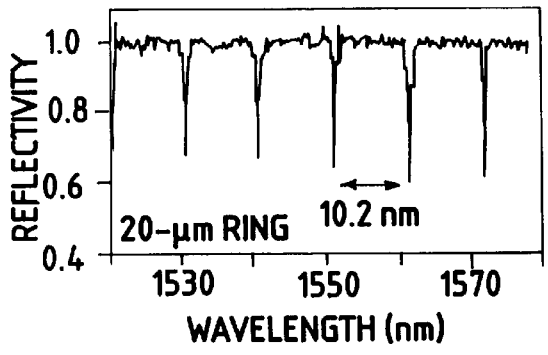

FIGS. 3A–D illustrate the reflectivity measured at the output port 20 of the waveguide 14 for microcavity resonators 12 in the respective form of a 10 μm diameter microcavity disk, a 10 μm microcavity ring, a 20 μm microcavity disk and a 20 μm microcavity ring. As shown in FIG. 3A for the 10.5 μm microcavity disk, the resonant wavelengths are 1534.4 nm, 1555.6 nm and 1577.2 nm. The noise depicted in this graph arises from the normalization required to remove Fabry-Perot resonances in the waveguide 14 and from the 10%–20%, 1 nm modulation of the laser diode output. The measured, free spectral range (FSR), which represents the spacing between resonant wavelengths, is 21.6 nm for the 10.5 μm diameter microcavity disk. For this example, the calculated reflectivity is given by the following equation:

$$1 - t_{max}/(1+F \sin^2 (2\pi n l/\lambda_0))$$

where the finesse, F, which accounts for scattering and coupling losses in the cavity of the microcavity resonator 12 is given by $F=4RA/(1-RA)^2$, the maximum transmission $t_{max}$ is given by $t_{max}=(1-R)^2A/(1-RA)^2$; the loss is accounted for by $A=\exp(-\alpha l)$ where $l=\pi D/2$; D is the outer diameter of the microcavity resonator 12; R is equal to (1-coupling efficiency); and α is the waveguide propagation or scattering loss. The calculated FSR, Δλ, is given by the equation $\Delta\lambda=\lambda^2/\pi D_{eff}n_g$ where $D_{eff}$ is the effective diameter of the microcavity resonator 12 and $n_g$ is the mode group refractive index and is given by $n_g=n_{eff}+\lambda(dn/d\lambda)$. For the case of the 10.5 μm microcavity disk, the calculated FSR is Δλ=21.8 nm with an estimated $D_{eff}$ of 10 μm which corresponds to the path traveled by the center of the 0.5 μm wide mode.

Figure 4A:
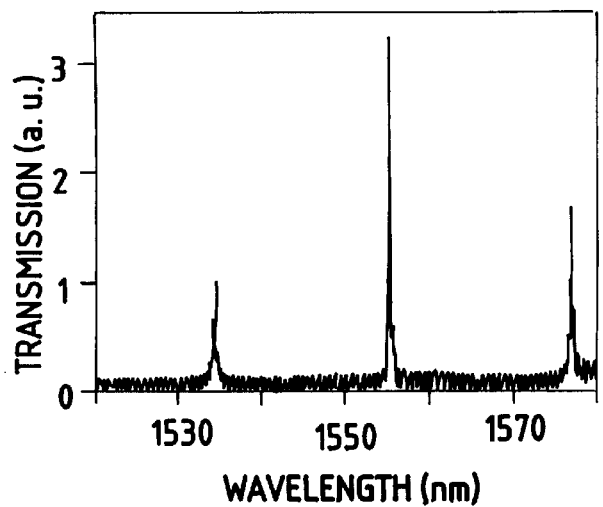
FIGS. 4A–B respectively show graphs of the unnormalized tranmissivity measured from the output port of the second waveguide with a 10.5 μm microcavity disk and the full width half maximum $\Delta\lambda_{FWHM}$ at the transmission peak.
Figure 4B:
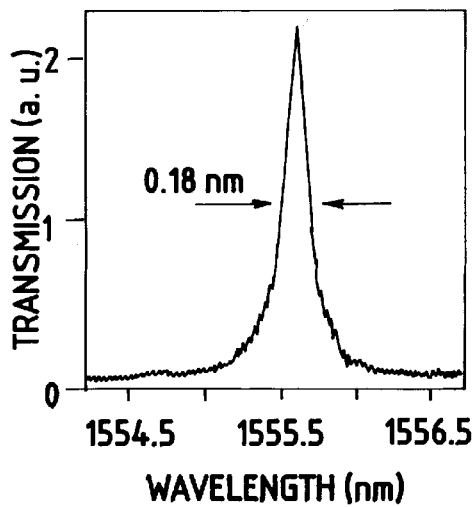

FIG. 4(a) shows the unnormalized transmissivity as measured from the output port 24 of the wave guide 16 for the 10.5 μm diameter microcavity disk. As shown in FIG. 4(b) depicting the fine range scan taken across the transmitted peak centered at the wavelength of 1555.6 nm, the full width at half maximum, $\Delta\lambda_{FWHM}$ is 0.18 nm with a 0.003 nm resolution.

It is noted that when there is strong waveguide confinement or guiding, the gap between the microcavity resonator 12 and the waveguides 14 and 16 should be very small for adequate coupling efficiency. However, for a given gap width, the coupling is increased by curving the waveguide along the microcavity resonator 12 for a finite distance. FIGS. 5 and 8 respectively illustrate such a micro-resonator design. As shown in FIGS. 5 and 8, light propagating in the waveguide 50 that is on resonance with the microcavity resonator 52 is coupled over an optical path length $\Delta s_2$ that is curved along the microcavity resonator 52 over an optical path length thereof of $\Delta\Delta s_1$. The waveguide 53 is similarly curved about the microcavity resonator 52. For a microcavity resonator 52 of 5 μm diameter and in the form of a microcavity ring, where it is assumed that the light in the waveguide 53 is in phase with the microcavity ring, a coupling efficiency of 1% is calculated for a coupling length of 1 μm($\lambda_0=1.55$ μm), a waveguide width a=0.4 μm, a waveguide thickness b=0.2 μm and a gap width a=0.3. However, the light propagating in the waveguide 50 and microcavity resonator 52 can go out of phase due to the optical path length difference $\Delta as_2-\Delta s_1$ after a certain arc angle θ. Limiting the phase mismatch to π/2 gives $\theta<(\lambda/2n)/(r_2-r_1)$ where $r_1$ and $r_2$ are the respective radii of curvature of the waveguide 50 and the microcavity resonator 52 respectively. Further, $\Delta s_2-\Delta_1\theta(r_2-r_1)$. For the parameters of this example, the coupling length should not exceed approximately 1/10th of the disk circumference in order to limit the phase mismatch to less than π/2.

It is noted that in the embodiment depicted in FIGS. 5 and 8, the on resonance light is output from the output port Y of the waveguide 53 in a direction that is opposite to the direction of the off resonance light output from the port Z of the waveguide 50. The waveguide 53, however, can be curved to output the light in any desired direction.

FIG. 6 illustrates a cross-sectional view of a weakly guiding micro-resonator device 10 that may be formed with a microcavity ring resonator or a microcavity disk resonator having a diameter of $560\lambda_{lg}/n_{res}$μm-$56000\lambda_{lg}/n_{res}$μm In this embodiment, a 3–4 μm AlGaAs first cladding layer 56 is formed on a GaAs substrate 58. A 1.5 μm AlGaAs guiding layer 60 is formed on the first cladding layer 56 and a 1.5 μm second cladding layer 62 of AlGaAs is formed on the guiding layer 60. Because there are high bending losses in a weakly confined microcavity resonator, the diameter of the microcavity resonator 12 is approximately in the range of $560\lambda_{lg}/n_{res}$ μm-$56000\lambda_{lg}/n_{res}$μm. In this embodiment, the weakly guided microcavity resonator 12 and waveguides 14 and 16 may be created by etching the second cladding layer 62 so as to result in low scattering losses. If the guiding layer 60 is not etched, the microcavity resonator 12 may be formed of a ring instead of a disc to increase the mode confinement but not increase the scattering losses. With a weakly guiding microcavity resonator, the gap separating the waveguides from the microcavity resonator may be larger than that employed in a micro-resonator 10 having a strongly guiding microcavity resonator. For a waveguide width a=1.4 μm thickness of b=1.5 μm and a gap, c=5 μm ($\lambda_{lg}=1.5$ μm), 1% of microcavity disk resonator to waveguide coupling is achieved over a 370 μm coupling length for a disk diameter of 1700 μm.

Figure 12A:
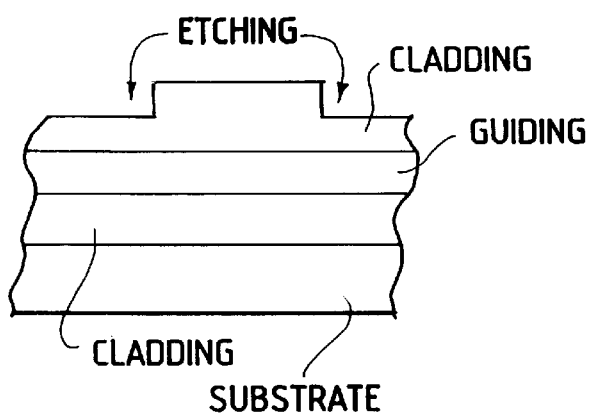
FIGS. 12A–C illustrate the etching of various layers of the wafer to form the microcavity resonator and waveguides of a weakly guiding device.
Figure 12B:
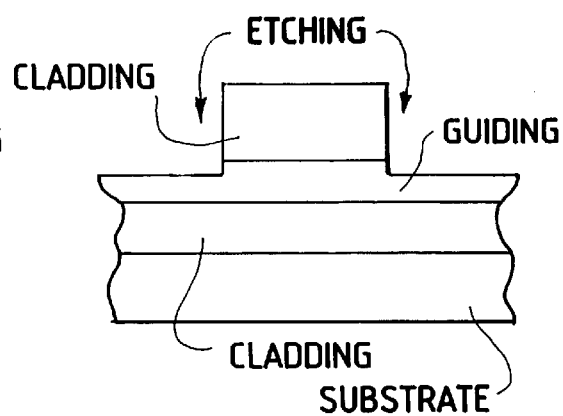
Figure 12C:
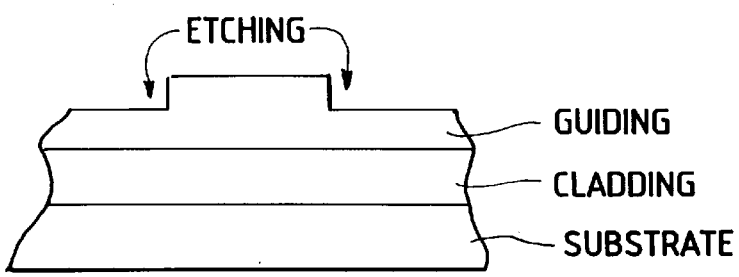

FIGS. 12A–C illustrate other embodiments of weakly guiding structures. As shown in FIG. 12A, the etching extends only into the second cladding layer to a depth that is less than the thickness of the second cladding layer. As shown in FIG. 12B, the etching extends into the guiding layer and can be as deep as approximately one-half of the thickness of the guiding layer. As shown in FIG. 12C, there is no second or top cladding layer and the etching reaches into the guiding layer and can be as deep as approximately one-half of the thickness of the guiding layer.

FIG. 7 illustrates another embodiment of a microcavity resonator that is strongly guiding. In this embodiment, the diameter of the microcavity resonator is less than or equal to approximately $560\lambda_{lg}/n_{res}\mu m$. A 2 $\mu m$ AlGaAs cladding layer 64 is formed on a GaAs substrate 66 and a 1 $\mu m$ AlGaAs guiding layer 68 is formed on top of the cladding layer 64. As discussed above, with the strongly guiding micro-resonator structure, the mode is very tightly confined so that the microcavity resonator 12 can have an extremely small diameter. The small diameter and tight confinement however lead to a lower coupling efficiency between the microcavity resonator 12 and the adjacent waveguides 14 and 16. Thus, small gap separations that are less than 1 $\mu m$ (for $\lambda_{lg}$=1.5) are preferred for adequate coupling. In the strongly-guiding case of FIG. 7, the waveguide sidewall is etched deeper than one-half of the thickness of the guiding layer and can reach into the first cladding layer 64. This is opposed to the case of the weakly guiding structure depicted in FIGS. 12A–C wherein the etching reaches at most approximately one-half of the thickness of the guiding layer as measured from the top. In the example depicted in FIG. 7, for a micro-resonator with a strongly guiding microcavity disk resonator 12 and a waveguide width a=0.94 $\mu m$, thickness b=1 $\mu m$ and a gap c=0.2 $\mu m$, the coupling is 1% for a coupling length of 11 $\mu m$ for $\lambda_{lg}$=1.5.

Figure 13A:
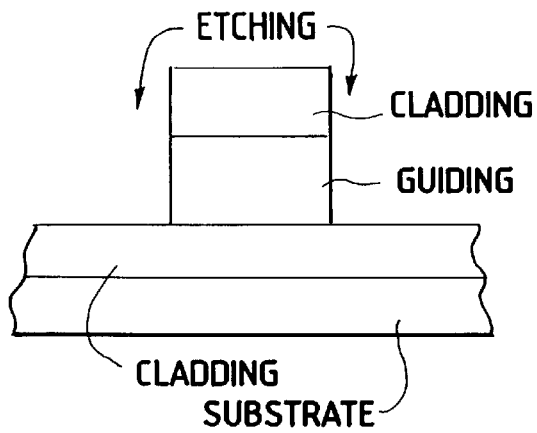
FIGS. 13A–C illustrate the etching of various layers of the wafer to form the microcavity resonator and waveguides of a strongly guiding device.
Figure 13B:
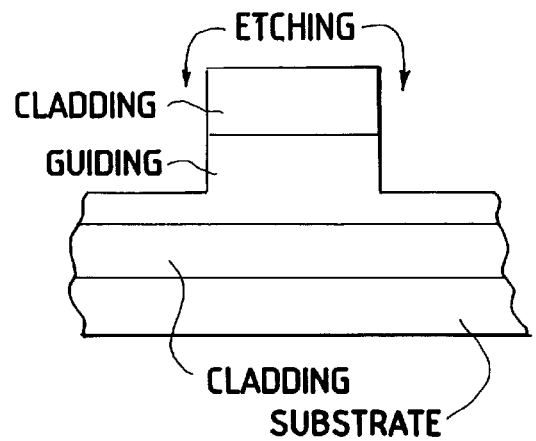
Figure 13C:
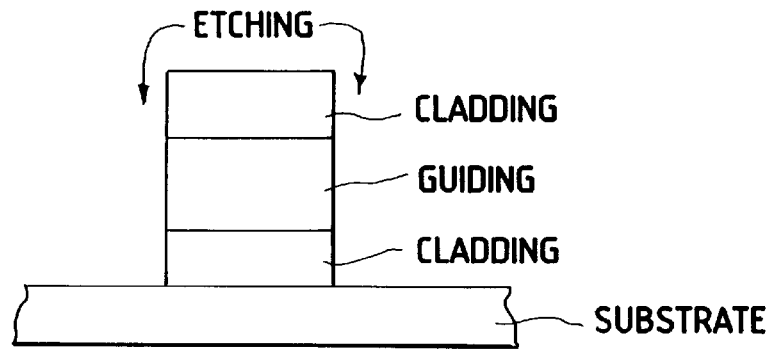

Other embodiments of strongly guiding structures includes FIGS. 13A–C. A second cladding layer 69 is formed on the guiding layer 68 and the etching reaches into the guiding layer to a depth that is more than one half of the thickness of the guiding layer from the top as seen in FIGS. 13A and B. In FIG. 13C, the etching extends into the first cladding layer 64l so that the first cladding layer is either fully or partially etched.

Figure 9:
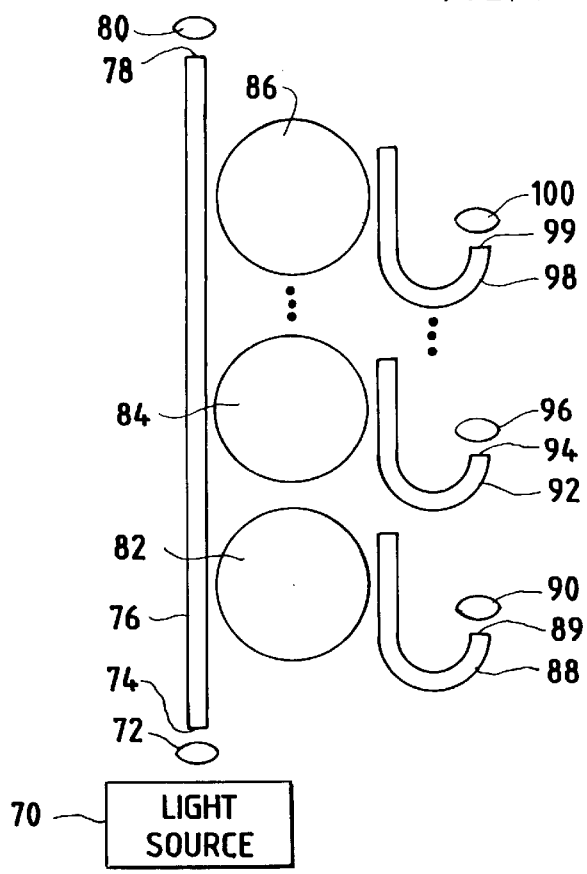
FIG. 9 illustrates one embodiment of a wavelength demultiplexing scheme using the microcavity resonator of the present invention.
Figure 10:
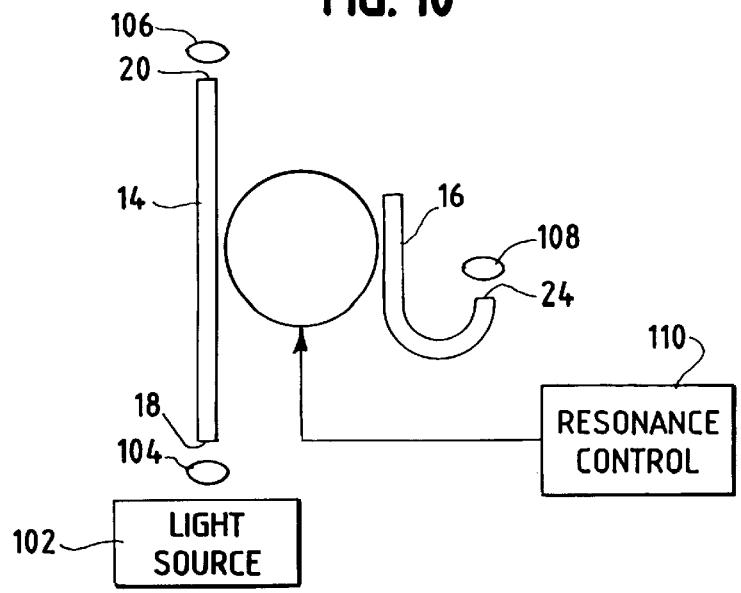
FIG. 10 illustrates an embodiment of an electrically tunable optical filter useable in a number of diverse applications.

The semiconductor micro-resonator device 10 may be used as an electro-optical modulator, a switch, a tunable optical filter, a wavelength division multiplexor and/or demultiplexor as well as other potential applications. The finesse, F, of the present invention is particularly advantageous for a number of these applications since the resonator potentially requires only a $\pi/F$ phase shift instead of a $\pi$ phase shift, thereby reducing the switching voltage required by a factor of F. Further, because the semiconductor micro-resonator in accordance with the present invention has a high finesse and high free spectral range, the device can be used as a demultiplexor with high wavelength resolution and wide wavelength tuning range that can reach the entire bandwidth of the Erbium-doped fiber amplifier. These factors further permit the resonator of the present invention to be used in dense wavelength-division multiplexing schemes which are particularly important when the device is to be employed in a fiber optic communication network. FIGS. 9 and 10 illustrate a few of these various applications.

FIG. 9 illustrates one embodiment of a demultiplexor utilizing the semiconductor micro-resonator device of the present invention. Light from a source 70 is focused by a lens 72 into the input port 74 of the waveguide 76. A number of microcavity resonators 82, 84 and 86, only three of which are shown for illustrative purposes, are disposed adjacent to the waveguide 76 along the length thereof. Although the waveguide 76 in FIG. 9 is illustrated as being straight, as discussed above, the coupling efficiency can be potentially increased by curving the successive lengths of the waveguide about a portion of the respective microcavity resonators 82, 84 and 86. Each of the microcavity resonators 82, 84 and 86 may be formed as a microcavity disk or a microcavity ring as discussed above. In this embodiment, each micro-cavity resonator 82, 84 and 86 is formed with a different refractive indice and/or different circumference of the optical path so that each resonator has a different resonance. The resonance of the respective microcavity resonator 82, 84, 86 is a function of the optical path length which is a function of the refractive index of the microcavity resonator and the circumference of the optical path of the microcavity resonator. Adjacent to each of the microcavity resonators 82, 84, 86 is another waveguide 88, 92, 98. As discussed above, in order for the light output from the waveguides 89,92 and 98 to be in the same direction as output from the port 78 of the waveguide 76, each of the waveguides 88, 92 and 98 is curved as shown in FIG. 9. A lens 80, 90, 96, 100 may be disposed with respect to an associated waveguide output port 78, 89, 94, 99 so as to collimate light output from the respective waveguide. It is noted, that although lenses are depicted in FIG. 9 at the input and output ports, lenses are not required.

In operation, light propagating in the waveguide 76 that is on resonance with the microcavity resonator 82 will be coupled thereto via resonant waveguide coupling and will be coupled from the microcavity resonator 82 to the waveguide 88 for output via the output port 89. Similarly, light propagating in the waveguide 76 that is on resonance with the microcavity resonator 84 will be coupled thereto and from the microcavity resonator 84 the light will be coupled via the waveguide 92 to the output port 94. Light propagating in the waveguide 76 that is on resonance with the microcavity resonator 86 will be coupled thereto and from the microcavity resonator 86 to the waveguide 98 for output via the output port 99. Therefore, by forming the microcavity resonators 82, 84 and 86 with different resonant wavelengths, each of these devices may be used to select a particular wave-length of light propagating in the waveguide 76 for output via its associated output waveguide, 88, 92 or 98. Light propagating in the waveguide 76 that is off resonance with each of the microcavity resonators will be output via the output port 78 of the waveguide 76.

Figure 14:
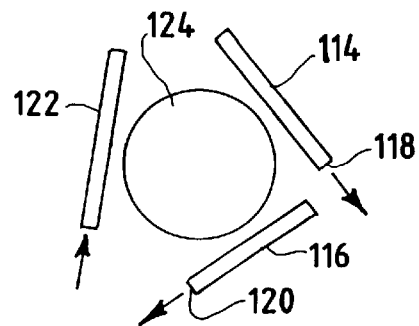
FIG. 14 illustrates an embodiment of the present invention with multiple output waveguides.

The number of the output waveguides can be more than one. For example as shown in FIG. 14. two output waveguides 114 and 116 have respective output ports 118 and 120. The input waveguide 122, microcavity resonator 124 and output waveguides 118 and 120 can have structures as described above. The amount of coupling to each of the output waveguides 118 and 120 can be different and is adjusted by different gap sizes between the respective waveguides 118 and 120 and the microcavity resonator 124.

FIG. 10 illustrates an electrically controlled, tunable optical filter. The device employs the micro-resonator structure depicted in FIG. 1 with a lens 104 for focusing light onto the input port 18 of the waveguide 14, a lens 106 from collimating light from the output port 20 of the waveguide 14 and a lens 108 for collimating light output from the output port 24 of the waveguide 16. As noted above the lenses are not required, particularly when the laser light is coupled directly to the device 10 from another semiconductor device on the same chip as the device 10. A resonance controller 110 outputs a variable voltage that creates a variable electric field applied to the microcavity resonator 12. Changes in the applied electric field induce changes in the refractive index of the microcavity resonator 12. Thus, by changing the electric field via the output voltage of the resonance controller 110, the microcavity resonator 12 may be tuned to various resonant wavelengths so that selective wavelengths of light propagating in the waveguide 14 are coupled to the microcavity resonator 12 depending on the resonant wavelength thereof as controlled by the controller 110 and for subsequent coupling to the waveguide 16 for output via the port 24. Such changes in the refractive index of the microcavity resonator 12 may be enhanced by having quantum wells in the semiconductor guiding layer. A further disposition of pn junctions within the guiding layer may also enhance the change in the refractive index via carriers introduced by injection current at the pn junction from the applied voltage.

The semiconductor micro-resonator device of the present invention has numerous applications, only a few of which are listed above. It is noted that the specific parameters set forth with respect to the described embodiments are merely examples. The parameters can be changed without departing from the teachings or the scope of the invention. Further, semiconductor materials different than described herein can be used to form the micro-resonator device 10 of the present invention. For example, it might be advantageous to substitute nitrogen, N, for Arsine, As. Thus, it is to be understood that, within the scope of the appended claims, the invention may be practiced otherwise than as described herein and above.

What is claimed and desired to be secured by Letters Patent is:

1. A semiconductor micro-resonator device having a range of operating wavelengths of light including a longest wavelength $\lambda_{lg}$ of light comprising:

a microcavity resonator capable of propagating light and formed of semiconductor materials with a diameter of approximately $56000 \lambda_{lg}/n_{res}$ or less where $n_{res}$ is the propagating refractive index of light in the microcavity resonator;

an input waveguide for propagating light therein formed of semiconductor materials and having an input port and an output port, a portion of said input waveguide being disposed adjacent to said microcavity resonator but separated therefrom by a gap that is less than $$\frac{2\lambda_{lg}}{\sqrt{n_{res}^2 - n_{gap}^2}}$$

where $n_{gap}$ is a propagating refractive index of the gap;

an output waveguide for propagating light therein formed of semiconductor materials having an output port, a portion of said output waveguide being disposed adjacent to said microcavity resonator but separated therefrom by a gap that is less than $$\frac{2\lambda_{lg}}{\sqrt{n_{res}^2 - n_{gap}^2}}$$

where $n_{gap}$ is a propagating refractive index of the gap; wherein light propagating in said input waveguide with a wavelength off resonance with said microcavity resonator is output from said output port of said input waveguide and light propagating in said input waveguide with a wavelength on resonance with said microcavity resonator is coupled to said microcavity resonator and from said microcavity resonator to said output waveguide for output from the output port of said output waveguide wherein said microcavity resonator and waveguides are formed of multilayer semiconductors including a substrate, a first cladding layer disposed on top of said substrate, a guiding layer disposed on top of said first cladding layer and a second cladding layer disposed on top of said guiding layer, said guiding layer having a variable refractive index.

2. A semiconductor micro-resonator device as recited in claim 1 wherein the guiding layer has a refractive index variable by an applied voltage.

3. A semiconductor micro-resonator device as recited in claim 1 wherein the guiding layer has a refractive index variable by an injection current to tune the resonance of said micro-resonator device.

4. A semiconductor micro-resonator device as recited in claim 1 wherein the guiding layer is formed of semiconductor materials having quantum wells.

5. A semiconductor micro-resonator device as recited in claim 1 wherein the guiding layer is formed of semiconductor materials having pn junctions.

6. A semiconductor micro-resonator device as recited in claim 1 wherein said guiding layer is formed of $Al_xGa_{1-x}N$ where $0 \leq x \leq 1$.

7. A semiconductor micro-resonator device as recited in claim 1 including a plurality of output waveguides disposed adjacent to said microcavity resonator.

8. A semiconductor micro-resonator device as recited in claim 1 wherein said first and/or second cladding layer is a transparent conductor.

9. A semiconductor micro-resonator device as recited in claim 1 wherein said first and/or second cladding layer is $InSnO_2$.

10. A semiconductor micro-resonator device as recited in claim 1 wherein said microcavity resonator and waveguides are formed by etching said top cladding layer either fully or partially in a pattern defining the outer walls of said microcavity resonator and waveguides.

11. A semiconductor micro-resonator device as recited in claim 1 wherein said microcavity resonator and waveguides are formed from a wafer of said multilayer semiconductor and the outer sidewalls of said microcavity resonator and waveguides are formed by etching said cladding layer and said guiding layer of said wafer in a desired geometry.

12. A semiconductor micro-resonator device as recited in claim 1 wherein said etching extends into said first cladding layer.

13. A semiconductor micro-resonator device having a range of operating wavelengths of light including a longest wavelength $\lambda_{lg}$ of light comprising:

a microcavity resonator capable of propagating light and formed of semiconductor materials with a diameter of approximately $56000 \lambda_{lg}/n_{res}$ or less where $n_{res}$ is the propagating refractive index of light in the microcavity resonator;

an input waveguide for propagating light therein formed of semiconductor materials and having an input port and an output port, a portion of said input waveguide being disposed adjacent to said microcavity resonator but separated therefrom by a gap that is less than $$\frac{2\lambda_{lg}}{\sqrt{n_{res}^2 - n_{gap}^2}}$$

where $n_{gap}$ is a propagating refractive index of the gap;

a plurality of waveguides for propagating light therein, each formed of semiconductor materials and having an output port, a portion of each of said output waveguides being disposed adjacent to said microcavity resonator but separated therefrom by a gap that is less than $$\frac{2\lambda_{lg}}{\sqrt{n_{res}^2 - n_{gap}^2}}$$

where $n_{gap}$ is a propagating refractive index of the gap; wherein light propagating in said input waveguide with a wavelength off resonance with said microcavity resonator is output from said output port of said input waveguide and light propagating in said input waveguide with a wavelength on resonance with said microcavity resonator is coupled to said microcavity resonator and from said microcavity resonator to said output waveguides for output from the output ports of said output waveguides.

14. A semiconductor micro-resonator device as recited in claim 13 wherein the guiding layer has a refractive index variable by an applied voltage.

15. A semiconductor micro-resonator device as recited in claim 13 wherein the guiding layer has a refractive index variable by an injection current to tune the resonance of said micro-resonator device.

16. A semiconductor micro-resonator device as recited in claim 13 wherein the guiding layer is formed of semiconductor materials having quantum wells.

17. A semiconductor micro-resonator device as recited in claim 13 wherein the guiding layer is formed of semiconductor materials having pn junctions.

18. A semiconductor micro-resonator device as recited in claim 13 wherein said guiding layer is formed of $Al_xGa_{1-x}N$ where $0 \leq x \leq 1$.

19. A semiconductor micro-resonator device as recited in claim 13 wherein said first and/or second cladding layer is a transparent conductor.

20. A semiconductor micro-resonator device as recited in claim 13 wherein said first and/or second cladding layer is $InSnO_2$.

21. A semiconductor micro-resonator device as recited in claim 13 wherein said microcavity resonator and waveguides are formed by etching said top cladding layer either fully or partially in a pattern defining the outer walls of said microcavity resonator and waveguides.

22. A semiconductor micro-resonator device as recited in claim 13 wherein said microcavity resonator and waveguides are formed from a wafer of said multilayer semiconductor and the outer sidewalls of said microcavity resonator and waveguides are formed by etching said cladding layer and said guiding layer of said wafer in a desired geometry.

23. A semiconductor micro-resonator device as recited in claim 13 wherein said etching extends into said first cladding layer.

* * * * *